United States Patent
Takano et al.

(10) Patent No.: US 10,312,197 B2
(45) Date of Patent: Jun. 4, 2019

(54) METHOD OF MANUFACTURING SEMICONDUCTOR DEVICE AND SEMICONDUCTOR DEVICE

(71) Applicant: Toshiba Memory Corporation, Tokyo (JP)

(72) Inventors: Yuusuke Takano, Yokkaichi Mie (JP); Takashi Imoto, Kamakura Kanagawa (JP); Takeshi Watanabe, Yokkaichi Mie (JP); Soichi Homma, Yokkaichi Mie (JP); Katsunori Shibuya, Miegun Kawgoe Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 14/475,326

(22) Filed: Sep. 2, 2014

(65) Prior Publication Data

US 2015/0171021 A1 Jun. 18, 2015

(30) Foreign Application Priority Data

Dec. 13, 2013 (JP) ................... 2013-258704

(51) Int. Cl.
*H01L 23/552* (2006.01)
*H01L 23/31* (2006.01)
(Continued)

(52) U.S. Cl.
CPC ........ *H01L 23/552* (2013.01); *H01L 23/3128* (2013.01); *H01L 24/97* (2013.01);
(Continued)

(58) Field of Classification Search
CPC .......... H01L 21/02266; H01L 21/2633; H01L 21/203; H01L 23/552; H01L 23/295
See application file for complete search history.

(56) References Cited

U.S. PATENT DOCUMENTS

| 4,343,677 A * | 8/1982 | Kinsbron | .................. C23F 4/00 |
| | | | 204/192.32 |
| 6,037,666 A | 3/2000 | Tajima | |

(Continued)

FOREIGN PATENT DOCUMENTS

| JP | H03-130373 | 6/1991 |
| JP | 1994236981 A | 8/1994 |

(Continued)

OTHER PUBLICATIONS

J. Almerico et al, "Plasma Etching of Thick BCB Polymer Films for Flip Chip Bonding of Hybrid Compound Semiconductor-Silicon Devices", 2004; www.csmantech.org/Digests/2004/2004Papers/10A.5.pdf.*

(Continued)

*Primary Examiner* — Michael Lebentritt
*Assistant Examiner* — Suberr L Chi
(74) *Attorney, Agent, or Firm* — Kim & Stewart LLP

(57) ABSTRACT

According to one embodiment, a method of manufacturing a semiconductor device includes forming a sealing resin layer containing an inorganic filler so as to seal a semiconductor chip, removing a portion of the surface of the sealing resin layer by dry etching such that a portion of the inorganic filler is exposed, and forming a shield layer so as to cover at least the sealing resin layer.

19 Claims, 5 Drawing Sheets

(51) Int. Cl.
*H01L 23/00* (2006.01)
*H01L 23/29* (2006.01)
*H01L 21/56* (2006.01)

(52) U.S. Cl.
CPC .......... *H01L 21/561* (2013.01); *H01L 23/295* (2013.01); *H01L 24/32* (2013.01); *H01L 24/48* (2013.01); *H01L 24/73* (2013.01); *H01L 2223/5442* (2013.01); *H01L 2223/54406* (2013.01); *H01L 2223/54433* (2013.01); *H01L 2223/54486* (2013.01); *H01L 2224/32225* (2013.01); *H01L 2224/48095* (2013.01); *H01L 2224/48227* (2013.01); *H01L 2224/73265* (2013.01); *H01L 2224/97* (2013.01); *H01L 2924/00014* (2013.01); *H01L 2924/12042* (2013.01); *H01L 2924/15159* (2013.01); *H01L 2924/15311* (2013.01); *H01L 2924/181* (2013.01)

(56) References Cited

U.S. PATENT DOCUMENTS

| | | | |
|---|---|---|---|
| 2002/0159242 | A1* | 10/2002 | Nakatani ............... H01L 21/561 361/760 |
| 2008/0083957 | A1 | 4/2008 | Wei et al. |
| 2009/0294930 | A1* | 12/2009 | Yoon ..................... H01L 23/552 257/660 |
| 2012/0015687 | A1 | 1/2012 | Yamada et al. |
| 2012/0187585 | A1 | 7/2012 | Yamazaki |
| 2013/0168231 | A1* | 7/2013 | Yang ................. H01J 37/32091 204/192.12 |
| 2013/0249014 | A1 | 9/2013 | Kito |

FOREIGN PATENT DOCUMENTS

| | | |
|---|---|---|
| JP | H07-45948 | 2/1995 |
| JP | 2002-083450 | 3/2002 |
| JP | 2003-264373 | 9/2003 |
| JP | 2003-273113 | 9/2003 |
| JP | 2004111695 A | 4/2004 |
| JP | 2005-109306 | 4/2005 |
| JP | 2007103632 A | 4/2007 |
| JP | 2007281393 A | 10/2007 |
| JP | 2011142204 A | 7/2011 |
| JP | 2012-151326 | 8/2012 |
| TW | I333687 B | 11/2010 |

OTHER PUBLICATIONS

Machine Translation of IDS Reference, JP 2005-109306.*
Human translation of Yoshihisa et al., JP 2005-109306 (IDS Reference).*
Taiwan Office Action dated Oct. 23, 2015, filed in Taiwan counterpart Patent Application No. 103125175, 7 pages (with English translation).
Japanese Office Action dated Jan. 10, 2017, filed in Japanese counterpart Application No. 2013-258704, 13 pages (with English translation).
Taiwan Office Action dated May 10, 2016, filed in Taiwan counterpart Patent Application No. 103125175, 8 pages (with English translation).
Chinese First Office Action dated Feb. 20, 2017, filed in Chinese counterpart Patent Application No. 2014104525846, 10 pages (with English translation).
Japanese Decision to Grant a Patent dated Aug. 29, 2017, filed in Japanese counterpart Patent Application No. 2013-258704, 6 pages (with English translation).
Chinese Second Office Action dated Aug. 15, 2017, filed in Chinese counterpart Patent Application No. 201410452584.6, 13 pages (with English translation).
Chinese Office Action dated Dec. 12, 2017, filed in counterpart Chinese Patent Application No. 201410452584.6, 12 pages (with Translation).

* cited by examiner

METHOD OF MANUFACTURING SEMICONDUCTOR DEVICE AND SEMICONDUCTOR DEVICE

CROSS-REFERENCE TO RELATED APPLICATION

This application is based upon and claims the benefit of priority from Japanese Patent Application No. 2013-258704, filed Dec. 13, 2013, the entire contents of which are incorporated herein by reference.

FIELD

Embodiments described herein relate generally to a method of manufacturing a semiconductor device, and the semiconductor device.

BACKGROUND

A semiconductor device for a communication device uses a structure in which the surface of a sealing resin layer is covered with a shield layer in order to suppress electromagnetic disturbance such as electromagnetic interference (EMI). In order to obtain a sufficient shielding effect by the above described structure, it is preferable to electrically connect the shield layer to a ground wire, thereby releasing electromagnetic wave noise to the outside through the ground wire.

In the semiconductor device, in terms of reliability, it is preferable to improve adhesion between the shield layer and the sealing resin layer. Also, in terms of the shielding effect, it is preferable that the electric resistivity between the shield layer and the ground wire be low. In order to improve adhesion between the shield layer and the sealing resin layer, for example, a structure having a buffer layer (a base layer) formed of stainless steel (such as SUS 304) is being studied. However, the electric resistivity of stainless steel is about $72 \times 10^{-8}$ $\Omega$m, which is higher than, for example, the electric resistivity of a shield layer using copper or silver.

DETAILED DESCRIPTION

The embodiment provides improved adhesion between a shield layer and a sealing resin layer.

In general, according to one embodiment, a method of manufacturing a semiconductor device includes forming a sealing resin layer containing an inorganic filler so as to seal a semiconductor chip, removing some portions of the sealing resin layer by dry etching, such that some portions of the inorganic filler are exposed, and forming a shield layer so as to cover at least the sealing resin layer.

Hereinafter, a semiconductor device of an embodiment will be described with reference to the accompanying drawings.

Figure 1:
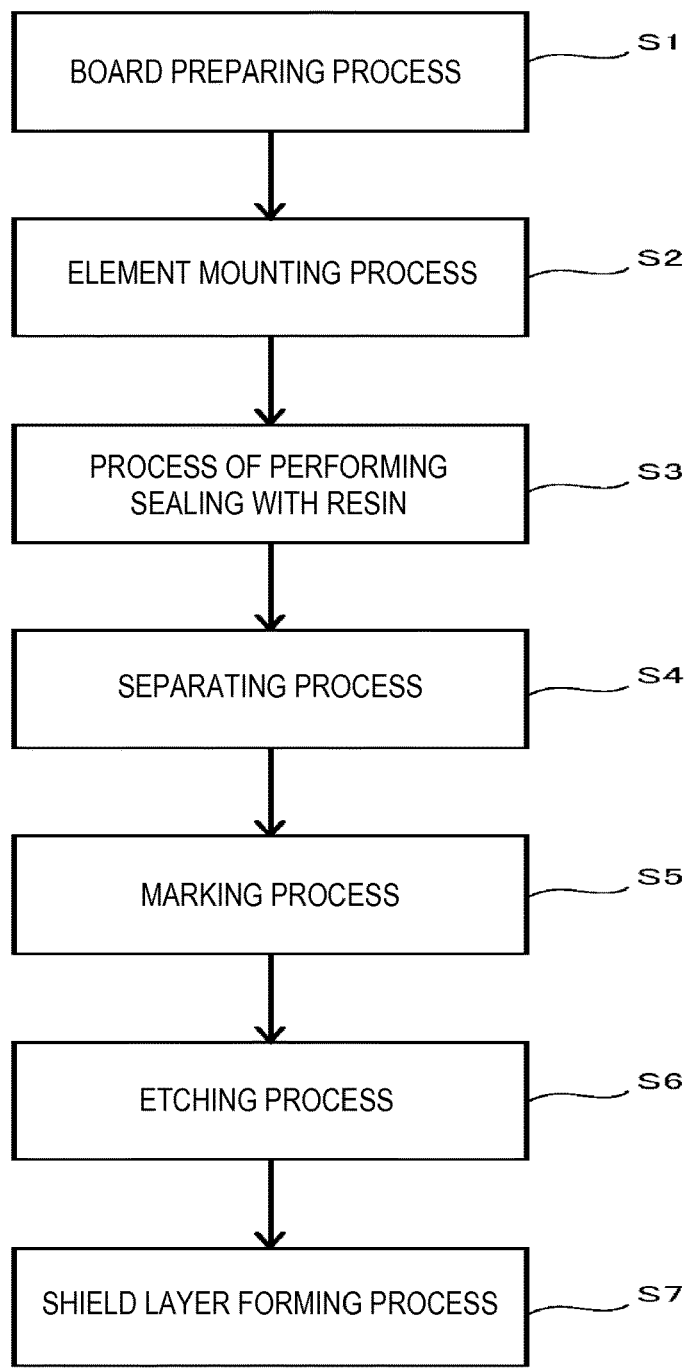
FIG. 1 is a flowchart illustrating an example of a method of manufacturing a semiconductor device.

FIG. 1 is a flowchart illustrating an example of a method of manufacturing a semiconductor device according to the present embodiment. The example of the method of manufacturing the semiconductor device illustrated in FIG. 1 includes a board preparing process (S1), an element mounting process (S2), a process of performing sealing with a resin (S3), a separating process (S4), a marking process (S5), an etching process (S6), and a shield layer forming process (S7). Also, the contents and order of the processes of the example of the method of manufacturing the semiconductor device according to the present embodiment are not necessarily limited to the processes illustrated in FIG. 1.

The board preparing process (S1) is a process of preparing a wiring board. Here, as an example, an aggregate board having a structure in which a plurality of wiring boards is connected in a matrix is manufactured.

The element mounting process (S2) is a process of mounting semiconductor chips on the wiring board. Also, in the element mounting process (S2), bonding may be performed, thereby connecting the semiconductor chips to wires such as signal wires and ground wires formed in the wiring board using bonding wires.

The process of performing sealing with the resin (S3) is a process of forming a sealing resin layer so as to seal the semiconductor chips. For example, it is possible to use a molding method such as a transfer molding method, a compression molding method, or an injection molding method to form the sealing resin layer. The sealing resin layer is formed so as to contain an inorganic filler (such as $SiO_2$). For example, the sealing resin layer may be formed of a mixture of the inorganic filler and an organic resin. The inorganic filler may be a particulate, and has a function of controlling the properties of the sealing resin layer, such as the degree of viscosity and the degree of hardness. The content of the inorganic filler in the sealing resin layer is, for example, 80% to 90%.

The separating process (S4) is a process of dicing the board to singulate each semiconductor device, thereby forming individual semiconductor devices. For example, a blade such as a diamond blade may be used to perform dicing.

The marking process (S5) is a process of marking product information, such as a product name, product numbers, the week and year of manufacture, and the manufacturing facility where produced, on the upper surfaces of the sealing resin layers formed on the separated wiring boards, by a laser marking apparatus having, for example, a YAG laser. Also, after the marking process (S5), a thermal treatment may be performed.

The etching process (S6) is a process of removing a portion of each sealing resin layer by dry etching or the like. For example, reverse sputtering (sputter etching) may be used to remove a portion of each sealing resin layer. Reverse sputtering is a process of applying a voltage in an inert gas atmosphere or the like, thereby generating plasma, and colliding ions of an inert gas to each workpiece board, thereby sputtering away the material of the surface of the corresponding board, such as an oxide. As the inert gas, for example, argon gas may be used.

The shield layer forming process (S7) is a process of forming a shield layer so as to cover at least the sealing resin layer in each marked semiconductor device. In the embodiments, the shield layer forming process S7 and the etching process S6 performed by reverse sputtering are both performed under vacuum conditions, and are preferably performed on a sealing resin layer without breaking vacuum, i.e., the sealing resin layer is exposed to the reverse sputtering plasma, and then exposed to a flux of sputtered shield layer material, with being removed from a vacuum system between the reverse sputtering and sputter deposition steps. The reverse sputtering may be performed in the same vacuum chamber environment where the sputter deposition of the shield material occurs, or in an adjacent vacuum environment.

As described above, the example of the method of manufacturing the semiconductor device according to the present embodiment includes at least a process of mounting a semiconductor chip on a wiring board, a process of forming a sealing resin layer containing an inorganic filler so as to seal the semiconductor chip, a process of removing some portions of the sealing resin layer by etching, and a process of forming a shield layer so as to cover at least the sealing resin layer.

Figure 2A:
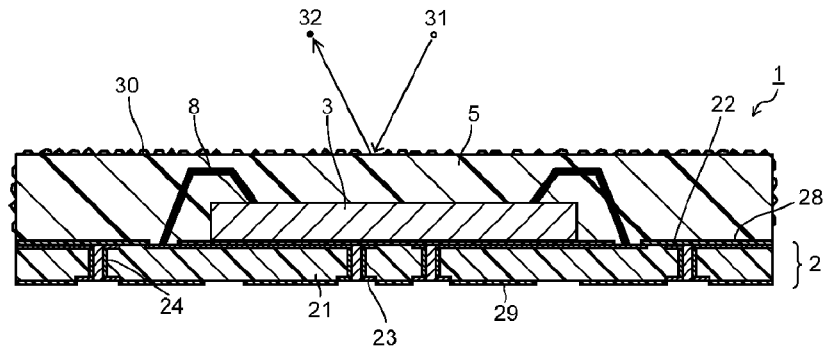
FIGS. 2A to 2C are cross-sectional views for explaining the example of the method of manufacturing the semiconductor device.
Figure 2B:
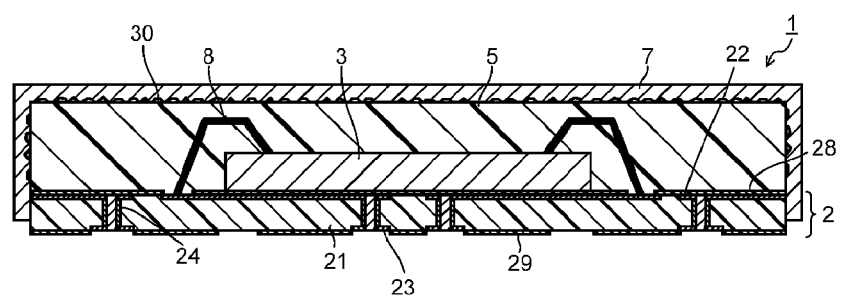
Figure 2C:
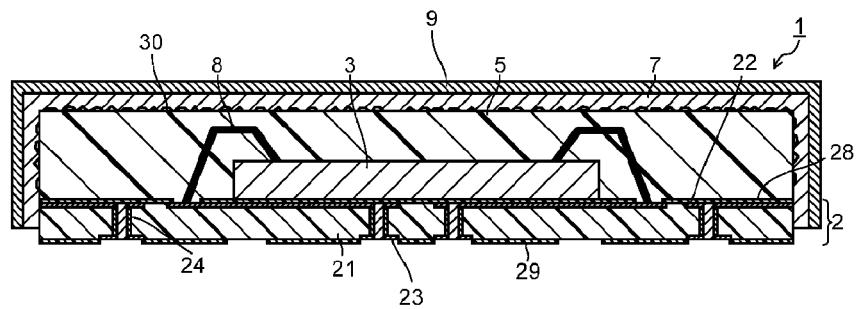

Subsequently, the etching process (S6) and the shield layer forming process (S7) will be described with reference to FIGS. 2A to 2C. FIGS. 2A to 2C are cross-sectional views for explaining the method of manufacturing the semiconductor device according to the present embodiment.

As illustrated as a semiconductor device 1 in FIG. 2A, an example of a semiconductor device formed through processes from the board preparing process (S1) up to the marking process (S5) includes a wiring board 2 that has a first surface and a second surface, a semiconductor chip 3 that has electrode pads, and is provided on the first surface of the wiring board 2, a sealing resin layer 5 that is provided on the first surface of the wiring board 2 and the semiconductor chip 3 so as to seal the semiconductor chip 3, and bonding wires 8. Also, the first surface of the wiring board 2 corresponds to the upper surface of the wiring board 2 of FIG. 2A, and the second surface corresponds to the lower surface of the wiring board 2 of FIG. 2A, and the first surface and second surface of the wiring board 2 face away from each other.

The wiring board 2 includes an insulating layer 21 that is formed between the first surface and the second surface, a wiring layer 22 that is formed on the first surface, a wiring layer 23 that is formed on the second surface, via holes 24 that pass through the insulating layer 21, a solder resist layer 28 that is formed on the wiring layer 22, and a solder resist layer 29 that is formed on the wiring layer 23.

In a case of using reverse sputtering in the etching process (S6), in general, the reverse sputtering is performed to remove oxides, dust, and the like attached to the surface. However, in the present embodiment, as illustrated in FIG. 2A, reverse sputtering is used to collide ions 31 of a plasma with the sealing resin layer 5, thereby sputtering away atom and molecule sized portions of the sealing resin layer 5 such that some bulk portion of the sealing resin layer 5 is removed.

In the etching process (S6), it is preferable to remove portions of the sealing resin layer 5 such that some portions of an inorganic filler 30 thereof are exposed. Specifically, it is preferable to remove some portions of the sealing resin layer 5 to a depth which is equal to or greater than 2.5 nm and is less than 7.5 nm, from the surface. For example, the depth to which the sealing resin layer 5 will be removed may be adjusted by controlling the conditions of etching, and in case of reverse sputtering, the depth to which the sealing resin layer 5 will be removed may be adjusted by controlling a reverse sputtering time, the flow of the inert gas, bias and the like. Also, it is preferable to expose some portions of the inorganic filler 30 from the side surface of the sealing resin layer 5 as illustrated in FIG. 2A.

The surface of the sealing resin layer 5 formed by the process of performing sealing with the resin (S3) has comparatively few irregularities and is smooth. For this reason, the sealing resin layer 5 may be considered as being low in adhesion with the shield layer to be formed by the shield layer forming process (S7). In contrast to this, if reverse sputtering or the like is performed, it is possible to improve the adhesion between the shield layer and the sealing resin layer 5. The reasons may be considered as an increase in the surface area of the sealing resin layer 5, an anchor effect due to fine irregularities of the exposed inorganic filler 30, and the like.

Also, if the entire surface of the sealing resin layer 5 is ashed by the reverse sputtering, i.e., the material at the surface is chemically converted, such as in a reactive plasma, adhesion of the shield layer therewith will be deteriorated. For this reason, it is preferable to perform the reverse sputtering in a range in which the entire surface of the sealing resin layer 5 is not ashed.

In the shield layer forming process (S7), as illustrated in FIG. 2B, a shield layer 7 is formed so as to cover at least the exposed surface of the sealing resin layer 5 in the semiconductor device 1. For example, the reverse sputtering is performed by the above described etching process (S6), and then in the shield layer forming process (S7), a conductive film is formed of copper, silver, or the like by sputtering of a target composed of the shield layer material to deposit that material on the sealing resin layer 5, whereby the shield layer 7 is formed. In this case, it is possible to perform consecutive processes without exposing each workpiece board to atmospheric air between the etching and the shield layer forming steps.

Besides sputtering, for example, a transfer method, a screen printing method, a spray coating method, a jet dispensing method, an inkjet method, or an aerosol method may be used to apply a conductive paste on the sealing resin layer 5, thereby forming the shield layer 7. In this case, it is preferable that the conductive paste should contain, for example, a resin and either silver or copper as main components, and have low electric resistivity. Alternatively, a method of forming a film of cooper, nickel, or the like by an electroless plating method or an electrolytic plating method may be applied to form the shield layer 7.

Further, as illustrated in FIG. 2C, if necessary, it is possible to form a protective layer 9 on the shield layer having superior in corrosion resistance and electro-migration resistance as compared to the shield layer 7. Also, before formation of the protective layer 9, etching of the shield layer 7 such as reverse sputtering may be performed again similarly to the etching process (S6) of the resin layer 5. In this case, it is possible to improve adhesion between the shield layer 7 and the protective layer 9.

Thereafter, external connection terminals are formed on the electrode pads of the wiring layer 23. Alternatively, the external connection terminals may be formed in the element mounting process (S2). Also, the example of the method of manufacturing the semiconductor device may further include a process of measuring the resistance value of the manufactured semiconductor device by use of the external connection terminals, thereby determining whether or not the semiconductor device is a good product. Until now, the example of the method of manufacturing the semiconductor device according to the present embodiment has been described.

Subsequently, an example of the structure of a semiconductor device which may be manufactured by the example of the method of manufacturing the semiconductor device according to the present embodiment will be described.

Figure 3A:
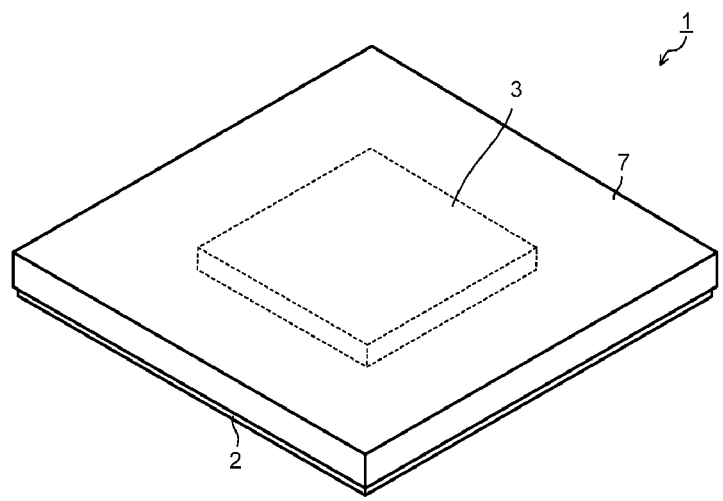
FIGS. 3A and 3B are perspective views illustrating an example of the structure of the semiconductor device.
Figure 3B:
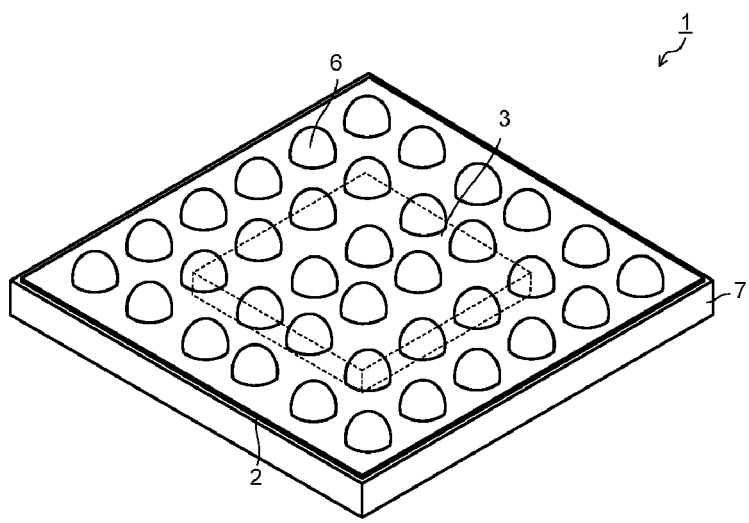

FIGS. 3A and 3B are perspective views illustrating the example of the structure of the semiconductor device. More specifically, FIG. 3A is a perspective view illustrates a state where the front surface faces upward, and FIG. 3B is a perspective view illustrating a state where the rear surface faces upward. The semiconductor device 1 illustrated in FIGS. 3A and 3B includes a wiring board 2, a semiconductor chip 3, a shield layer 7 that covers the semiconductor chip 3 and adjacent areas of the wiring board 2, and external connection terminals 6 having solder balls. Also, in FIG. 3B, the external connection terminals 6 are uniform in size. However, the sizes and positions of the individual external connection terminals 6 are not limited to those illustrated in FIG. 3B. Also, the semiconductor device illustrated in FIGS. 3A and 3B is a BGA (Ball Grid Array) type. However, the present disclosure is not limited thereto.

Figure 4:
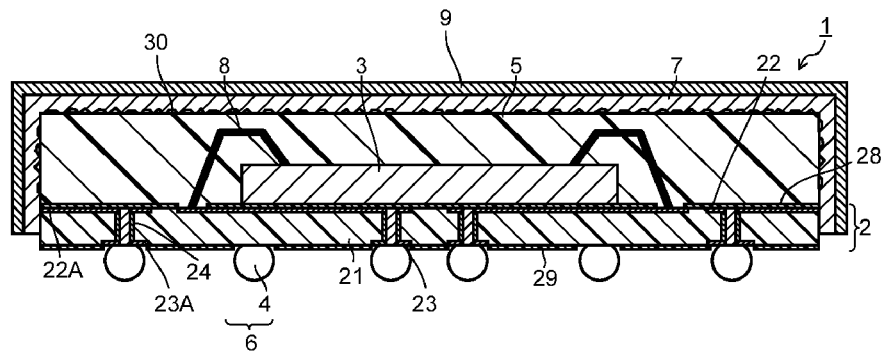
FIG. 4 is a cross-sectional view illustrating the example of the structure of the semiconductor device.

FIG. 4 is a cross-sectional view illustrating the example of the structure of the semiconductor device illustrated in FIGS. 3A and 3B. The semiconductor device 1 illustrated in FIG. 4 includes the semiconductor chip 3 that is provided on a first surface of the wiring board 2, a sealing resin layer 5 that is formed on the first surface of the wiring board 2 so as to seal the semiconductor chip 3, the external connection terminals 6 that are formed on a second surface, the shield layer 7 that covers at least the sealing resin layer 5, bonding wires 8, and a protective layer 9 that covers the shield layer 7.

Also, the first surface of the wiring board 2 corresponds to the upper surface of the wiring board 2 in FIG. 4, and the second surface corresponds to the lower surface of the wiring board 2 in FIG. 4, and the first surface and second surface of the wiring board 2 face away from each other. Further, with respect to components which are included in the semiconductor device of FIG. 4 and are denoted by the same reference symbols as those of FIGS. 2A to 2C, the descriptions of corresponding components of FIGS. 2A to 2C may be appropriately referred to in the prior discussion hereof.

The wiring board 2 includes an insulating layer 21 that is formed between the first surface and the second surface, a wiring layer 22 that is formed on the first surface, a wiring layer 23 that is formed on the second surface, via holes 24 that pass through the insulating layer 21, a solder resist layer 28 that is formed on the wiring layer 22, and a solder resist layer 29 that is formed on the wiring layer 23.

As the insulating layer 21, for example, a silicon substrate, a glass substrate, a ceramic substrate, or a resin substrate such as a glass epoxy substrate may be used.

As the sealing resin layer 5, a layer which contains an inorganic filler such as $SiO_2$, for example, a layer which is formed of a mixture of the inorganic filler and an insulating organic resin material, or a mixture of the inorganic filler and an epoxy resin may be used.

In the wiring layer 22 and the wiring layer 23, for example, signal wires, power supply wires, a ground wire, and the like are formed. Each of the wiring layer 22 and the wiring layer 23 is not limited to a single layer structure, and may have a laminate structure of a plurality of conductive layers electrically connected through holes formed in insulating layers with the insulating layers formed therebetween.

For the wiring layer 22 and the wiring layer 23, for example, a conductive paste containing copper, silver, or both of them is used, and if necessary, it is possible to perform nickel plating, gold plating, or the like on their surfaces.

A plurality of via holes 24 pass through the insulating layer 21. The via holes 24 include, for example, conductive layers formed on the inner surfaces of holes formed in the insulating layer 21, and a hole filling material filled inside the conductive layers. For the conductive layers, for example, a conductive paste containing copper, silver, or both of them is used, and if necessary, it is possible to perform nickel plating, gold plating, or the like on their surfaces. The hole filling material is formed of, for example, an insulating material or a conductive material. However, the present disclosure is not limited thereto. For example, the via holes 24 may be formed by filling a metal material (such as copper) in through-holes by plating.

As the external connection terminals 6, for example, signal wires, power supply wires, a ground wire, and the like are formed. The external connection terminals 6 are electrically connected to the wiring layer 22 through the wiring layer 23 and the via holes 24. The external connection terminals 6 have solder balls 4. The solder balls 4 are formed on the connection pads of the wiring layer 23. Alternatively, instead of the solder balls 4, lands may be formed.

The shield layer 7 is in contact with the inorganic filler 30 of the sealing resin layer 5. The shield layer 7 has a function of blocking extraneous electromagnetic energy waves emitted from the semiconductor chip 3 or the like, thereby suppressing the electromagnetic energy waves from leaking to the outside of the packaged semiconductor device. It is preferable that, for example, a metal layer having low electric resistivity should be used as the shield layer 7, and it is preferable that, for example, a metal layer containing copper, silver, nickel or the like should be used as the shield layer 7. If a metal layer having low electric resistivity is used as the shield layer 7, it is possible to suppress leakage of extraneous electromagnetic energy waves emitted through the semiconductor chip 3 or the wiring board 2.

It is preferable to set the thickness of the shield layer 7 based on the electric resistivity of the shield layer 7. For example, it is preferable to set the thickness of the shield layer 7 such that a sheet resistance value which is obtained by dividing the electric resistivity of the shield layer 7 by the thickness becomes 0.5Ω or less. If the sheet resistance value of the shield layer 7 is set to 0.5Ω, it is possible to reproducibly suppress leakage of extraneous electromagnetic waves from the sealing resin layer 5.

The bonding wires 8 are electrically connected to the wiring layer 22 and the semiconductor chip 3. For example, the semiconductor chip 3 is electrically connected to the signal wires and the ground wire by the bonding wires 8.

Further, as illustrated in FIG. 4, the shield layer may be formed such that at least a portion of the side surface of the wiring board 2, and thus the side or end surface of a wire 22A on or in the wiring layer 22 is exposed at the side surface of the wiring board 2, whereby the side surface of the wire 22A is brought into contact with the shield layer 7. In this case, the wire 22A serves as the ground wire. Since the wire 22A is electrically connected to the shield layer 7, it is possible to release extraneous electromagnetic energy waves to the outside of the packaged semiconductor device through the ground wire. However, the present disclosure is not limited thereto. The side or end surface of a wire 23A of the wiring layer 23 may be in contact with the shield layer 7. In that case, the wire 23A serves as the ground wire.

Also, a plurality of portions of the wire 22A of the wiring layer 22 may be exposed at from the side surface of the wiring board 2. In this case, since it is possible to increase the surface area of the wire 22A which is exposed at the side surface of the wiring board 2, it is possible to reduce the contact resistance between the wire 22A and the shield layer 7, and it is possible to improve the shielding effect. Also, in the semiconductor device of the present embodiment, since the ground wire is disposed along the peripheral edge of the wiring board 2, the ground wire may serve as a shield layer, thereby suppressing leakage of extraneous electromagnetic energy waves emitted through the semiconductor chip 3 or the wiring board 2.

For the protective layer 9, for example, stainless steel (such as SUS 304) or a polyimide resin may be used.

Further, the structure of the semiconductor device of the present embodiment is not limited to the above described structure. Other examples of the structure of the semiconductor device will be described with reference to FIGS. 5 and 6. With respect to components of semiconductor devices illustrated in FIGS. 5 and 6 and identical to those of the semiconductor device illustrated in FIG. 4, the same reference symbols are given, and the descriptions of the semiconductor device illustrated in FIG. 4 are appropriately referred to.

Figure 5:
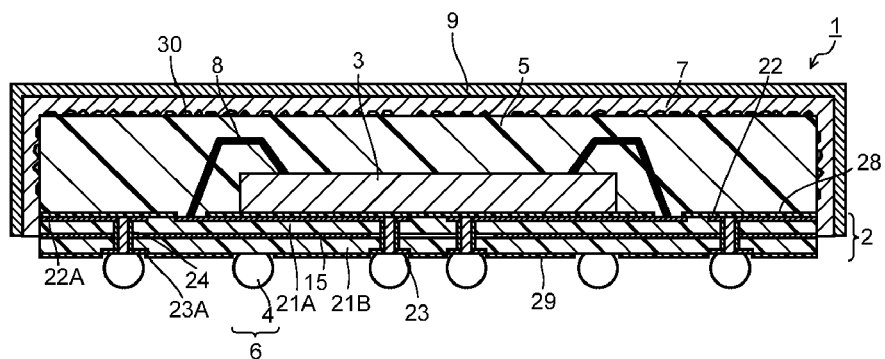
FIG. 5 is a cross-sectional view illustrating another example of the structure of the semiconductor device.

The board 2 of the semiconductor device 1 illustrated in FIG. 5 includes an insulating layer 21A and an insulating layer 21B, instead of the single insulating layer 21 of the semiconductor device 1 illustrated in FIG. 4, and further includes a conductive layer 15 that is formed between the insulating layer 21A and the insulating layer 21B. Also, with respect to components denoted by the same reference symbols as those of FIG. 4, such as the semiconductor chip 3, the sealing resin layer 5, the external connection terminals 6, the shield layer 7, the bonding wires 8, and the protective layer 9, the descriptions of the semiconductor device 1 illustrated in FIG. 4 are appropriately referred to.

As the insulating layer 21A and the insulating layer 21B, for example, materials used as the insulating layer 21 may be used.

It is preferable that the conductive layer 15 should extend under at least a portion of the semiconductor chip 3. The conductive layer 15 serves as a ground wire. It is preferable that the conductive layer 15 should be, for example, a solid film or a mesh film.

The conductive layer 15 is formed by forming a resist on a conductive film, for example, by a photolithographic technique, and removing some portions of the conductive film using the resist as a mask. For the conductive film, it is preferable to use, for example, a material used as the shield layer 7.

Also, the via holes 24 are formed through the insulating layer 21A, the conductive layer 15, and the insulating layer 21B. Further, the via holes 24 which are electrically connected to the signal wires and the like are electrically isolated from the conductive layer 15. For example, if holes are formed in the conductive layer 15 in advance, it is possible to electrically isolate the conductive layer 15 from the via holes 24 which are electrically connected to the signal wires and the like. Also, the wire 22A and the wire 23A are electrically connected to the conductive layer 15. With respect to the configurations of the wire 22A, the wire 23A, and the via holes 24, the descriptions of the semiconductor device 1 illustrated in FIG. 4 are referred to.

Since the conductive layer 15 is formed, it is possible to improve the effect of suppressing leakage of extraneous electromagnetic waves through the wiring board 2. Further, it is preferable that the side surface (end surface of the conductive layer 15 at the edge of the board) of the conductive layer 15 should be in contact with the shield layer 7. In this case, since it is possible to increase the area of contacts with the shield layer 7, it is possible to suppress connection failure between the shield layer 7 and the external connection terminal 6 to be a ground terminal. Also, since it is possible to reduce the contact resistance, it is possible to improve the shielding effect.

Figure 6:
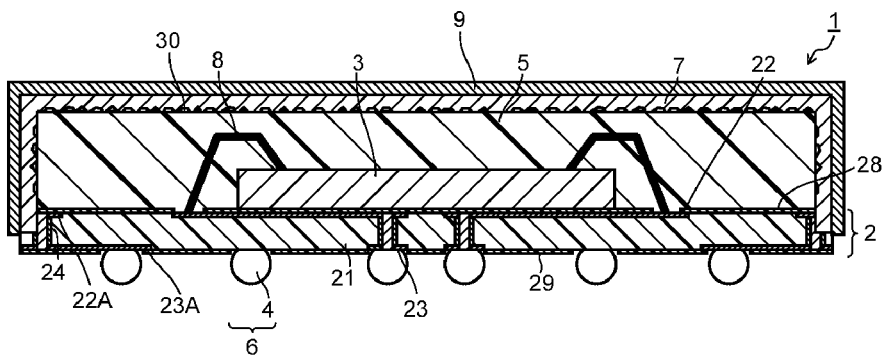
FIG. 6 is a cross-sectional view illustrating a further example of the structure of the semiconductor device.

A semiconductor device 1 illustrated in FIG. 6 has a structure in which some via holes 24 of the semiconductor device 1 illustrated in FIG. 4 are disposed at the peripheral edge of the wiring board 2, and are cut in the thickness direction (the direction in which the via holes 24 are formed) such that a portion thereof is exposed at the side surface of the wiring board 2. In this case, the wire 22A and the wire 23A serve as ground wires. As the cut surfaces of the via holes 24 are exposed at the side surface of the wiring board 2, they contact the shield layer 7. Also, in the semiconductor device 1 illustrated in FIG. 6, the via holes 24 have shapes sectioned at the middle positions in the thickness direction. However, the present disclosure is not limited thereto. The via holes 24 may have shapes sectioned at the end positions in the thickness direction (the direction in which the via holes 24 are formed). Also, the cut surface of each of the via holes 24 does not necessarily need to pass the center, and needs only to include a portion of the corresponding via hole 24.

If the cut surfaces of the via holes 24 are brought into contact with the shield layer 7, since it is possible to increase the contact area of the via holes 24 with the shield layer 7, that is, the contact areas of the ground wires with the shield layer 7, it is possible to reduce the contact resistance, and it is possible to improve the shielding effect. Also, instead of the insulating layer 21 of the semiconductor device 1 illustrated in FIG. 6, the insulating layer 21A and the insulating layer 21B illustrated in FIG. 5 may be provided, and the conductive layer 15 may be provided.

As described above, the semiconductor device according to the present embodiment may suppress leakage of extraneous electromagnetic waves emitted through the semiconductor chip 3 or the wiring board 2 by the shield layer 7. Therefore, the semiconductor device according to the present embodiment is suitable for applications to mobile information communication terminals such as smart phones, and tablet type information communication terminals.

EXAMPLE

In the present example, semiconductor devices actually manufactured, and the results of adhesion tests on the semiconductor devices will be described.

In the present example, in the processes illustrated in the embodiment, different reverse sputtering times for the etching process (S6) are set for a plurality of samples, respectively, and the plurality of samples are manufactured. Then, adhesion tests are performed on the manufactured semiconductor device samples. At that time, conditions for reverse sputtering are set such that the etching rate of the inorganic filler contained in each sealing resin layer is 15 angstroms (1.5 nm) per minute. Also, as the adhesion tests, tape peeling tests according to the standards of JIS H 8504 and the like are performed. The results are illustrated in FIG. 7.

Figure 7:
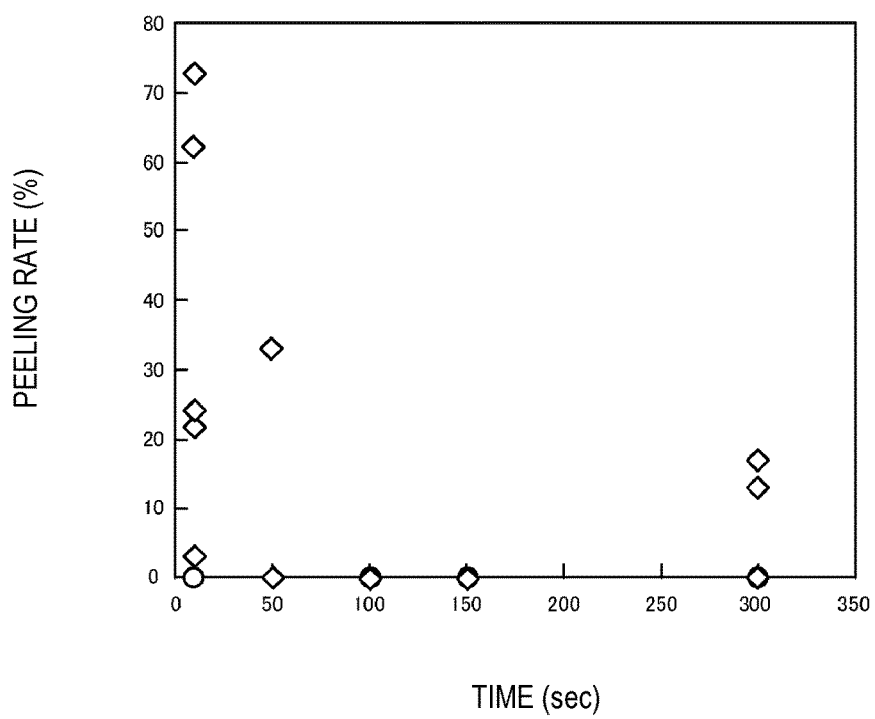
FIG. 7 is a view illustrating the results of adhesion tests on semiconductor devices.

In FIG. 7, the horizontal axis represents reverse sputtering time (sec), and the vertical axis represents the ratio of a portion of a sample peeled off by an adhesion test to the corresponding total area of the sample (a peeling rate (%)), and circular marks represent samples having undergone adhesion tests after a predetermined time elapsed from sputtering, and rhomboidal marks represent samples having undergone adhesion tests after 100 hours elapsed being exposed to humidity under pressure.

As illustrated in FIG. 7, in a case the reverse sputtering time is less than 100 seconds (a case where the depth to which etching is performed is less than 2.5 nm), the peeling rate is high. This is because some portions of each sealing resin layer are not sufficiently removed by reverse sputtering. Similarly, even in a case where the reverse sputtering time is equal to or greater than 300 seconds (a case where the depth to which etching is performed is 7.5 nm or more), the peeling rate is high. This is because the entire surface of each sealing resin layer is asked by reverse sputtering. In contrast to this, in a case where the reverse sputtering time is equal to or greater than 100 seconds and is less than 300 seconds (the depth to which etching is performed is equal to or greater than 2.5 nm and is less than 7.5 nm), the peeling rate is low. From this, it may be seen that by adjusting the reverse sputtering time or the depth to which the sealing resin layer will be removed by reverse sputtering, it is possible to improve adhesion between the shield layer and the sealing resin layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
    mounting a plurality of semiconductor chips on a surface of a wiring board;
    enclosing the plurality of semiconductor chips on the surface of the wiring board in a sealing resin comprising an inorganic filler and an organic resin;
    cutting the wiring board and the sealing resin into a plurality of sealing resin layers each having at least one semiconductor chip therein;
    placing a separated sealing resin layer in a vacuum environment;
    removing a portion of the separated sealing resin layer by dry etching such that a portion of inorganic filler exposed at front and side surfaces of the sealing resin layer to form irregularities on the front and side surfaces of the sealing resin, the dry etching being carried out by sputter etching the surfaces of the at least one separated sealing resin layer within the vacuum environment; and
    forming a shield layer on the separated sealing resin layer by sputter deposition in the vacuum environment, the shield layer contacting the exposed portion of the inorganic filler on the front and side surfaces of the separated sealing resin layer, the shield layer being formed without removing the separated sealing resin layer from the vacuum environment after the dry etching.

2. The method according to claim 1, further comprising forming a protective layer on the shield layer after forming the shield layer.

3. The method of claim 2, wherein the protective layer comprises a material having a greater corrosion resistance and electro-migration resistance than a material comprising the shield layer.

4. The method of claim 1, further comprising depositing wherein the shield layer is deposited such that a sheet resistance value thereof is 0.5Ω or less, the sheet resistance value being a value obtained by dividing an electrical resistivity of the shield layer by a thickness of the shield layer.

5. The method of claim 1, wherein the shield layer comprises copper.

6. The method of claim 1, wherein
    the semiconductor chip is mounted on the wiring board such that the semiconductor chip is electrically connected to a via extending through a thickness of the wiring board, the via being connected to a conductor of the wiring board extending to an edge of the wiring board; and
    the shield layer is electrically connected to the conductor of the wiring board at the edge of the wiring board.

7. The method of claim 6, wherein the conductor of the wiring board is a conductive mesh extending to the edge of the wiring board.

8. The method of claim 6, wherein the conductor of the wiring board is a solid film extending to the edge of the wiring board.

9. The method of claim 7, wherein the conductor is within an interior of the wiring board.

10. The method of claim 8, wherein the conductor is within an interior of the wiring board.

11. The method of claim 1, wherein the inorganic filler is a particulate.

12. The method of claim 1, wherein the dry etching is performed for at least 100 seconds, but less than 300 seconds.

13. A method of manufacturing a semiconductor device, the method comprising:
    mounting a plurality of semiconductor chips on a surface of a substrate, the substrate including an inner conductive layer electrically connected to a ground terminal of each semiconductor chip using at least one via exposed at the surface of the substrate;
    covering the plurality of semiconductor chips on the surface of the substrate with a sealing resin comprising an inorganic filler and an organic resin;
    cutting the sealing resin and the substrate to form a plurality of sealing resin layers, each having a semiconductor chip therein, the inner conductive layer of the substrate being exposed at a side edge of each sealing resin layer;
    placing a separated sealing resin layer in a vacuum environment;
    reverse sputter etching the front and side surfaces of the separated sealing layer in the vacuum environment to remove portions of the separated sealing layer to a depth between 2.5 nm and 7.5 nm such that a portion of the inorganic filler is exposed at the front and side surfaces of the separated sealing resin layer and irregularities are formed on the front and side surfaces of the separated sealing resin layer; and
    forming a shield layer on the separated sealing resin layer by sputter deposition in the vacuum environment, the shield layer contacting the exposed portion of the inorganic filler and being electrically connected to the inner conductive layer at the side edge of the separated sealing resin layer, the shield layer being formed without removing the separated sealing resin layer from the vacuum environment after reverse sputter etching the separated sealing resin layer.

14. The method of claim 13, further comprising:
ashing an entire surface of the separated sealing resin layer in the vacuum environment after the reverse sputter etching.

15. The method of to claim 13, further comprising forming a protective layer on the shield layer.

16. The method of claim 13, wherein the shield layer is deposited such that a sheet resistance value thereof is 0.5Ω or less, the sheet resistance value being a value obtained by dividing an electrical resistivity of the shield layer by a thickness of the shield layer.

17. The method of claim 13, wherein the inorganic filler is a particulate.

18. The method of claim 13, wherein the inner conductive layer is a mesh embedded within the substrate.

19. The method of claim 13, wherein the vacuum environment is a sputter chamber.

* * * * *